(12) United States Patent
Armstrong et al.

(10) Patent No.: US 6,690,041 B2
(45) Date of Patent: Feb. 10, 2004

(54) MONOLITHICALLY INTEGRATED DIODES IN THIN-FILM PHOTOVOLTAIC DEVICES

(75) Inventors: Joseph H. Armstrong, Littleton, CO (US); Scott Wiedeman, Tucson, AZ (US); Lawrence M. Woods, Erie, CO (US)

(73) Assignee: Global Solar Energy, Inc., Tucson, AZ (US)

( * ) Notice: Subject to any disclaimer, the term of this patent is extended or adjusted under 35 U.S.C. 154(b) by 0 days.

(21) Appl. No.: 10/143,750

(22) Filed: May 14, 2002

(65) Prior Publication Data

US 2003/0213974 A1 Nov. 20, 2003

(51) Int. Cl.⁷ .............................................. H01L 31/072
(52) U.S. Cl. ..................... 257/184; 257/186; 257/440; 257/83; 257/84; 438/22; 438/48
(58) Field of Search ................... 257/458–461, 257/83–84, 184–188, 440–443; 136/251–252, 244

(56) References Cited

U.S. PATENT DOCUMENTS

| | | | |
|---|---|---|---|
| 4,323,719 A | | 4/1982 | Green |
| 4,577,051 A | | 3/1986 | Hartman |
| 4,759,803 A | | 7/1988 | Cohen |
| 4,773,943 A | * | 9/1988 | Yamaguchi et al. ......... 136/244 |
| 4,933,022 A | | 6/1990 | Swanson |
| 5,248,346 A | | 9/1993 | Fraas et al. |
| 5,252,139 A | * | 10/1993 | Schmitt et al. ............. 136/251 |
| 5,389,158 A | | 2/1995 | Fraas et al. |
| 5,580,395 A | | 12/1996 | Yoshioka et al. |
| 5,616,185 A | | 4/1997 | Kukulka |
| 5,990,415 A | | 11/1999 | Green et al. |
| 6,034,321 A | * | 3/2000 | Jenkins ...................... 136/252 |
| 6,103,970 A | | 8/2000 | Kilmer et al. |
| 6,225,793 B1 | | 5/2001 | Dickmann |

* cited by examiner

*Primary Examiner*—Dung Le
(74) *Attorney, Agent, or Firm*—Preston Gates Ellis & Rouvelas Meeds LLP

(57) ABSTRACT

The present invention relates to the design of and includes monolithically integrated diodes for use in planar, thin-film, photovoltaic devices, such as solar cells.

17 Claims, 17 Drawing Sheets

MONOLITHICALLY INTEGRATED DIODES IN THIN-FILM PHOTOVOLTAIC DEVICES

This invention may have been made with U.S. Government support under Contract No. F29601-99-C-0152 awarded by the Air Force Research Laboratory. The Government may have certain rights in this invention.

BACKGROUND OF THE INVENTION

1. Field of the Invention

The present invention relates to the design and manufacture of and includes monolithically integrated diodes for use in various applications including in planar, thin-film, photovoltaic devices such as solar cells.

2. Description of the Prior Art

Photovoltaic (PV) cells generate an electric current when exposed to light (a photocurrent). PV cells thus have a wide variety of potential uses, including functioning as a power supply in certain terrestrial and space applications, acting as a photosensor to detect either a binary on-off presence of light as is required for certain security systems, and acting as a photosensor to detect varying intensities and/or wavelengths of light as is required for a variety of photographic and videographic applications. PV cells may produce photocurrent in response to a wide range or specific narrow band of the electromagnetic spectrum, including that band defined by the visible spectrum. In some applications, a PV cell that is transparent or translucent to a first frequency of light but produces a photocurrent in response to a second frequency is placed on top of a PV cell that produces a photocurrent in response to a first frequency. Although a PV cell produces current when exposed to light, when shadowed or shaded, it behaves as a diode. When a PV cell is described herein as being in a shadowed or shaded state, it means that it is not receiving sufficient light of the relevant wavelength or wavelengths to produce photocurrent.

A common practice in configuring PV cells, particularly when used in a power supply, is to place multiple cells in series. When a portion of the series or string of cells is shadowed, the shadowed cell (or cells) acts as a diode in reverse bias to the remainder of the series or string. As a result, the cell (or cells) acting as diodes in reverse bias tends to gain heat, which consequently damages that cell and potentially damages nearby cells. This heating is evidence of what is termed "destructive breakdown," which is detrimental to a cell. Moreover, the energy consumed in heating and breaking down the cell is wasted, thus producing a less efficient device.

One method that has been applied to overcoming the problem of shadowed cells is to incorporate diodes into the design of the series or string. These diodes traditionally have been discrete components that have been attached to the PV cell by soldering or similar techniques. The addition of these discrete diodes provides an alternate electrical path in the event of a shadowed or shaded cell.

Unfortunately, the additional diodes add to a module's weight, thickness, complexity, and cost of manufacture, while decreasing its reliability. Moreover, many of the connection techniques used to attach discrete diodes impose additional constraints (e.g., rigidity) on the cell, further limiting its usefulness. Examples of designs that utilize discrete diodes include U.S. Pat. Nos. 6,255,793, 6,103,970, and 4,577,051. Other techniques which have been used include diodes which are integrated into the design of the cell. These may rely on "C" or "S" shaped interconnects to connect adjacent cells. An example of such a design is U.S. Pat. No. 5,616,185. These designs reduce the active area of the cell, thereby reducing efficiency.

Other designs involving integrated diodes make use of both sides of the PV cell. Some examples of this type of design include U.S. Pat. Nos. 5,580,395 and 4,323,719. Because these designs include additional layers on the bottom or reverse of the cell, they make the cell inherently thicker, and consequently heavier. Additionally, these designs increase the complexity of the design, and the cost of both materials and manufacture. Other techniques for creating integrated diodes do so by means of special doping techniques. Examples of this kind of design include U.S. Pat. Nos. 5,990,415, 5,389,158, 5,389,158, 5,248,346, and 4,933,022.

Another technique for creating integrated diodes includes adding additional partial layers to the surface of the cell and connecting these "integrated diodes" to the cell using integrated circuit techniques. An example of this type of design is U.S. Pat. No. 4,759,803.

An ideal design would provide an individual bypass diode for each PV cell, however, cost, size, and weight constraints may limit the designer to include only one bypass diode for every two or more series PV cells. In these configurations, the total number of cells which are in parallel to each bypass diode may be bypassed if only one of the PV cells of the group is shadowed, yielding less than optimal efficiency. Moreover, the larger bypassed voltage may require more robust diodes to avoid exposing the bypass diode to a voltage greater than or equal to its breakdown voltage.

SUMMARY OF THE INVENTION

The present invention relates to the design and manufacture of and includes monolithically integrated diodes for use in various applications including planar, thin-film PV devices such as solar cells. The design of the present invention is exemplified by an embodiment based upon a string of PV cells into which diodes have been monolithically integrated. The design produces a series or string of PV cells that have reduced weight, thickness, cost, and complexity while achieving increased reliability compared to the prior art. Other advantages of the present invention include its ability to be used in flexible thin film devices, its ability to extend the life span of PV cell series or strings, and its ability to increase manufacturing output. The integrated diode of the present invention is also capable of acting as a bypass diode, or as a blocking diode, to prevent the reverse flow of current from, for example, the electrical bus or parallel series or string to which the series or string may be connected.

One embodiment of the present invention, for example, overcomes the problem of discrete components through a monolithic integration technique which permits diodes to be fully integrated without the need for discrete components.

One embodiment of the present invention is created by providing a photovoltaic cell. This cell may comprise a substrate, and deposited on this substrate there may be a conducting layer, upon which a p-type absorber layer may be deposited. The cell may further comprise an n-type window layer deposited on this p-type absorber layer. The substrate may, for example, comprise an electrically insulating top surface, such as Upilex®, polyimide, polyphenylene benzobis oxazole (PBO), polyamide, polyether ether ketone, or metallic foils coated with one of these electrically insulating materials. The conducting layer may, for example, comprise molybdenum, transparent conductive oxides, brass, titanium, nickel, or nickel-vanadium. The p-type absorber layer may, for example, comprise a device made of copper-indium-gallium-selenide, copper-indium-selenide, copper-aluminum-selenide, copper-indium-aluminum-selenide, or other compounds like those mentioned that substitute (in whole or part) silver for copper or sulfur for selenide or both. The n-type window layer may, for example, comprise cadmium sulfide, cadmium zinc sulfide, zinc sulfide, zinc selenide, cadmium selenide, zinc-indium selenide, or indium selenide. Next, one may remove a portion of the cell including the n-type window layer, the p-type absorber layer, and the conducting layer, thereby producing a trench or groove defined by the edges of the remaining portions of the cell. A preferred way to remove these layers is by means of laser scribing. Other techniques to remove these layers include, for example, chemical etching, electronic etching (such as, for example, e-beam writing or electron scribing), and mechanical scribing. Chemical etching may require masking to prevent unwanted removal of other portions of the layers. These techniques are sometimes referred to as scribing, and the resulting trench or groove as a scribe.

Depending on the method of removal used, it may be desirable to clean the groove or trench to remove debris or other by-products of the removal process. One may also apply an insulating material to fill this trench. This insulating material may, for example, comprise a resistive ink, a dielectric, a pottant, or an encapsulant. Several methods for applying insulating material such as resistive ink include bubblejet deposition, inkjet deposition, or other types of liquid media printing techniques including screen printing.

Additionally, one may remove a portion of the cell parallel to the insulating material by, for example, removing the n-type window layer and p-type absorber layer, thereby defining a second trench. This removal of a portion of the cell may be performed by, for example, the above described techniques.

Following this removal, a layer of translucent conductive oxide, such as, for example, indium tin oxide (ITO), may be applied to the surface of the cell and may include the insulating material and trench. One may again remove a portion of the cell that may include the translucent conductive oxide layer, the n-type window layer, and the p-type absorber layer, forming a trench defined by the edges of the remaining cell. This removal of a portion of the cell may be performed by, for example, the above described techniques.

An opaque layer may also be added to a portion of the cell corresponding to the desired diodes. The opaque layer may comprise any opaque material, such as, for example, a metal, in particular, aluminum, molybdenum, silver, or titanium may be desirable. Other translucent materials that are sufficiently opaque may be used. Other materials that are opaque at certain times, such as, for example materials such as are used in liquid crystal displays may be used, and may provide greater flexibility in the design of circuits that integrate embodiments of the present invention. Other materials may be used in the opaque layer such as, for example, materials that are polarized in such a manner as to sufficiently shade or shadow the underlying layers. Several ways to apply the opaque layer include physical vapor deposition, chemical vapor deposition, sputtering, evaporation, and chemical bath deposition.

In a further embodiment of the present invention, a module of photovoltaic cells may be manufactured using the method of the present invention. One may begin, for example, by providing a substrate. Preferably, this substrate may be a flexible polyimide substrate, such as, for example, Upilex®, and may preferably be flat, planar, and rectangular.

A conductive layer may be deposited on this substrate and may, for example, comprise molybdenum. On the conductive layer, a p-type absorber layer may be deposited, and may comprise a copper-indium-gallium-selenide device. On the p-type absorber layer, an n-type window layer may be deposited, and may, for example, comprise cadmium sulfide. The intermediate products of this process will be referred to as "the sheet." This term is not meant to describe any functionality or dimensions, or to provide any limitation, but merely to provide a shorthand name for the product of the processes up to the point at which reference is to be made.

Additionally, one may remove a first portion of the sheet, including a portion of the n-type window layer, the p-type absorber layer, and the conductive layer. The portions of these layers may be removed so as to form a first trench or groove. This pattern of this first trench or groove in the sheet may be adapted to provide for a plurality of PV cells. Each PV cell may be considered as a two terminal device. For each PV cell desired, a first trench or groove may be included. Furthermore, a layer of electrical insulator, such as, for example, resistive ink may be applied to the sheet. The electrical insulator may be applied so as to replace the portion of the sheet removed by the first trench or groove.

An additional step in an embodiment of the present invention may be to remove a second portion of the sheet, including a portion of the n-type window layer and the p-type absorber layer, to form a second trench or groove. The second trench or groove may preferably be formed parallel to the first trench or groove. Preferably, the second trench or groove is near the first trench or groove, and may, if desired, be partially overlapping the first trench or groove. The second trench or groove may be formed prior to or during the application of the electrical insulator layer, if desired.

A further step in an embodiment of the present invention may be to apply a translucent conductive layer to the sheet including the n-type window layer, the conductive layer, and the second trench or groove. One may also remove a portion of the sheet including the translucent conductive layer, the n-type window layer, and the p-type absorber layer, to form a third trench or groove.

A third trench or groove may preferably be formed parallel to the second trench or groove. Preferably, the third trench or groove is near the second trench or groove, and may, if desired, be partially overlapping the second trench or groove. The pattern in which the trenches or grooves are arranged will determine the size and location of the PV cells.

Finally, an opaque layer may be applied to those portions which are intended for use as diodes. The opaque layer may comprise any opaque material, such as, for example, a metal. Other translucent materials that are sufficiently opaque may be used. Other materials that are opaque at certain times, such as, for example materials such as are used in liquid crystal displays may be used, and may provide greater flexibility in the design of circuits that integrate the present invention. Other materials may be used in the opaque layer such as, for example, materials that are polarized in such a manner as to sufficiently shade or shadow the underlying layers.

In an embodiment of the present invention, it may be convenient to locate the diodes along the edges of the module. Other locations which are a priori known to be likely to be shadowed or shaded may also provide good locations for diodes. The area of a diode of the present invention will be determined by the characteristics of the materials used, particularly the reverse-bias characteristics of the p-type absorber layer. Preferably the diodes should exhibit low internal resistances in forward bias and should not be required to face voltages approaching their breakdown voltages.

Cells or diodes may be isolated one from another as desired, by means of, for example, trenches or grooves. Additional electrical and environmental protection may be accomplished by, for example, encapsulating one or more cells or diodes in a dielectric material. This material may, for example, also fill the trenches or grooves and provide the benefit of additional isolation.

An object of the present invention is to provide a method of manufacturing diodes integrated into PV devices such as solar cells. It is another object of the present invention to provide a method of manufacturing diodes as bypass diodes integrated into PV devices such as solar cells. Yet another object of the present invention is to provide a method of manufacturing diodes as blocking diodes integrated into PV devices such as solar cells.

Another object of the present invention is to provide a method of manufacturing thin-film PV devices that are flexible, yet which comprise diodes, thereby eliminating the requirements made by discrete diodes, including for example, limitations of rigidity imposed by the diodes themselves and by the associated soldered connections.

It is a further object of the present invention to provide a low-cost, low-weight protected array of PV cells. This array may be of particular use in space applications, but may also be of use in terrestrial power generation. Another object of the present invention is to provide a protected array of PV cells which is thin, thereby saving volume, which may be of particular benefit in space applications.

Another object of the present invention is to provide a method of manufacturing diodes integrated into PV cells that does not significantly increase the complexity of the manufacture of PV cells. Thus, it is an object of the present invention to provide a method of manufacturing diodes integrated into PV cells that is less process intensive, and which may be accomplished using a relatively simple stacking sequence.

It is a further object of the present invention to provide a method of manufacturing a protected array of PV cells, in which the cells may be as small as 0.3 cm by 31 cm, thus allowing the production of 100V in less than 80 cm. In such a configuration, discrete diodes would have to be laid practically end to end. Given the high voltage of such an array, protection by means of diodes may be important.

It is an object of the present invention to provide a method of manufacturing a protected array of PV cells which reduces the complexity of manufacture by eliminating the steps of pick-and-place, bonding, and soldering.

It is understood that both the foregoing general description and the following detailed description are exemplary and explanatory only and are not restrictive of the invention as claimed. The invention is described in terms of a purely electrical device, however, one skilled in the art will recognize other uses for this invention, such as, for example, an electro-chemical or bio-electric device. The accompanying drawings illustrating an embodiment of the invention and together with the description serve to explain the principles of the invention.

DETAILED DESCRIPTION OF THE PREFERRED EMBODIMENTS

Figure 1A:
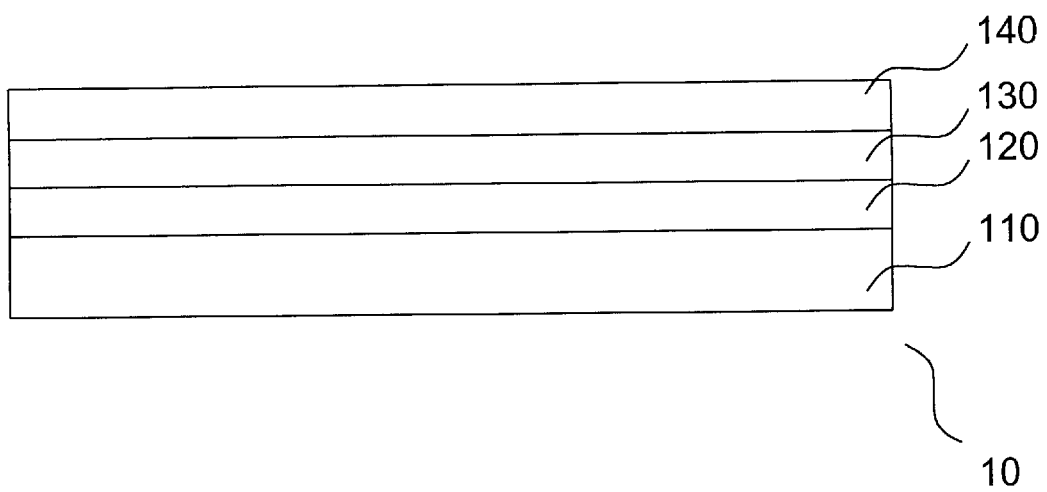
FIG. 1a is a schematic diagram of an embodiment of the present invention that illustrates a first stage in its production.

It is to be understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "a layer" is a reference to one or more layers and includes equivalents thereof known to those skilled in the art. For example, the p-type absorber layer may comprise a copper-indium-gallium-selenide device, which itself may comprise a plurality of layers, some of which may not, in themselves function as p-type absorbers. Additionally, it is important to note that the verb "deposit" in several forms is used herein. This verb is not intended to limit methods of connecting one layer to another to traditional deposition, but is meant to include other methods including, for example, methods involving ceramic-to-ceramic bonding, "growing," and metal-to-ceramic bonding. Moreover, herein the adjective translucent is used to indicate that a substance permits some (up to and including all) electromagnetic radiation of the relevant wavelength to pass through it, regardless of the effect of the substance on its ability to transmit coherent images. Thus, transparent as used herein defines a subset of those materials identified as translucent. The invention is described in terms of a diode, however, one of ordinary skill in the art will recognize other applications for this invention including, for example, a monolithically integrated triode or resistor.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. All references cited herein are incorporated by reference herein in their entirety.

FIGS. 1a–g depict a preferred embodiment of the present invention. One may begin by providing a photovoltaic cell (10). Cell (10), as depicted for example in FIG. 1a, may comprise a substrate (110), and deposited on substrate (110), a conducting layer (120), and deposited on conducting layer (120) a p-type absorber layer (130), and deposited on p-type absorber (130) an n-type window layer (140). Substrate (110) may, for example, comprise Upilex®. Conducting layer (120) may, for example, comprise molybdenum. P-type absorber layer (130) may, for example, comprise a copper-indium-gallium-selenide device. N-type window layer (140) may, for example, comprise cadmium sulfide.

Figure 1B:
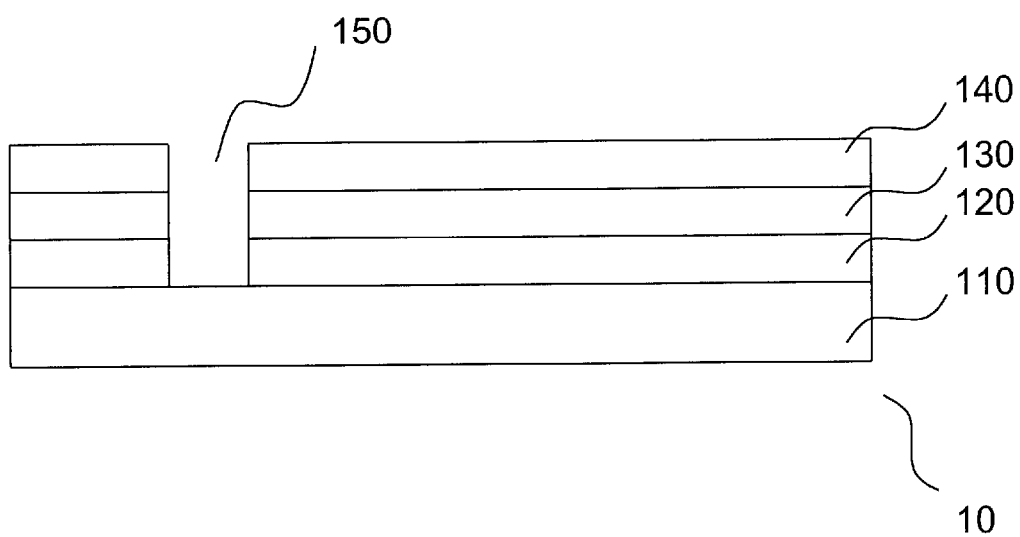
FIG. 1b is a schematic diagram of an embodiment of the present invention that illustrates a second stage in its production.

Further, as for example depicted in FIG. 1b, one may remove a portion of cell (10) including n-type window layer (140), p-type absorber layer (130), and conducting layer (120), thereby producing a first trench or groove (150) defined by the edges of the remaining portions of cell (10). A preferred way to remove these layers is by means of laser scribing. Other techniques include, for example, chemical etching and mechanical scribing. Using chemical etching may require the use of masking to prevent unwanted removal of other portions of the layers. Depending on the method of removal used, it may be desirable to clean first trench (150) to remove debris or other by-products of the removal process.

Figure 1C:
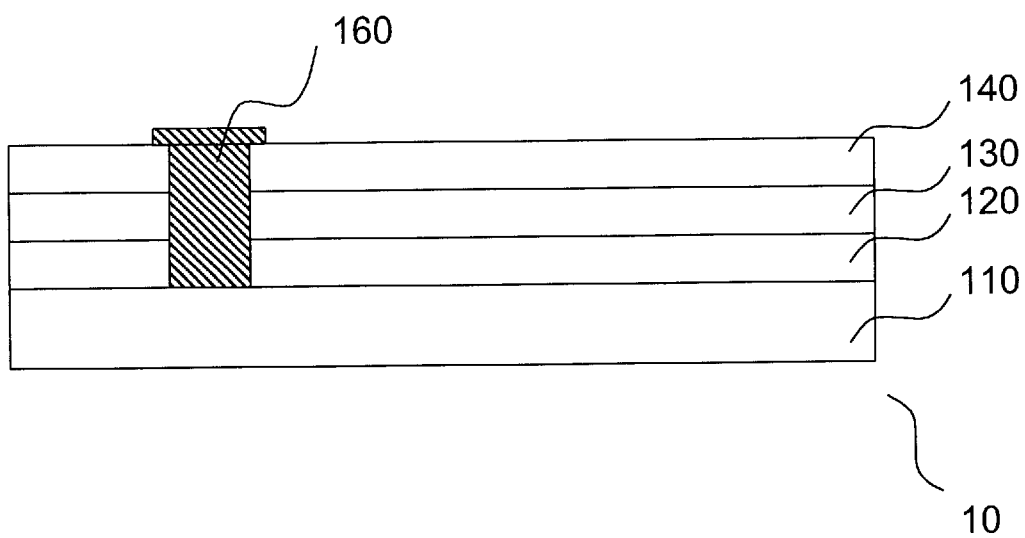
FIG. 1c is a schematic diagram of an embodiment of the present invention that illustrates a third stage in its production.

Additionally, as depicted for example in FIG. 1c, one may apply an electrically insulating material (160) to fill first trench (150). Electrically insulating material (160) may, for example, comprise a resistive ink.

Figure 1D:
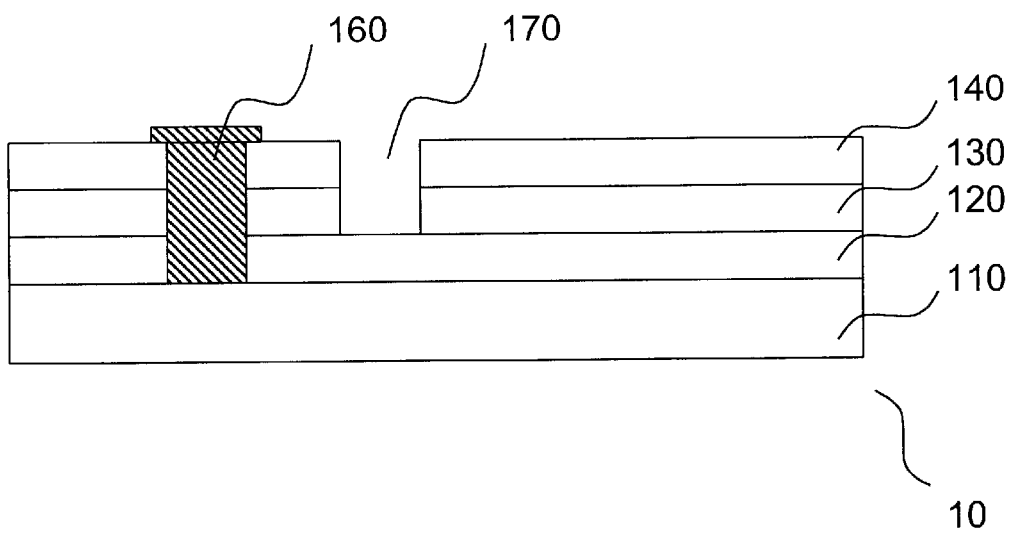
FIG. 1d is a schematic diagram of an embodiment of the present invention that illustrates a fourth stage in its production.

As depicted for example in FIG. 1d, one may also remove a portion of cell (10) parallel to electrically insulating material (160), removing n-type window layer (140) and p-type absorber layer (130), thereby defining a second trench (170). This removal of a portion of cell (10) may be performed by, for example, the above described techniques.

Figure 1E:
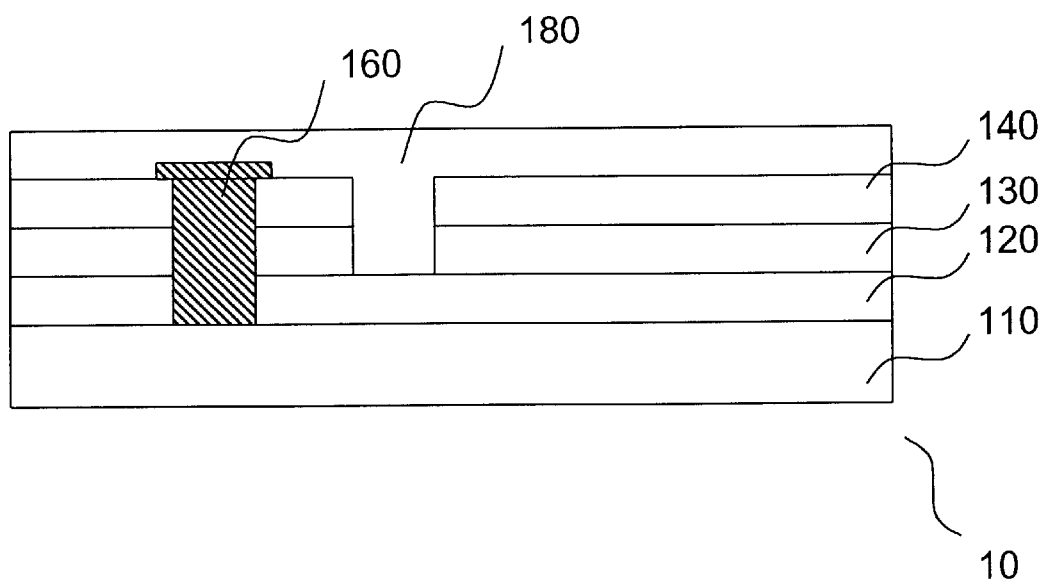
FIG. 1e is a schematic diagram of an embodiment of the present invention that illustrates a fifth stage in its production.

Following the above described removal, a layer of translucent conductive oxide (180), such as, for example, indium tin oxide, maybe applied to the surface of cell (10) including electrically insulating material (160) and second trench (170) as depicted for example in FIG. 1e.

Figure 1F:
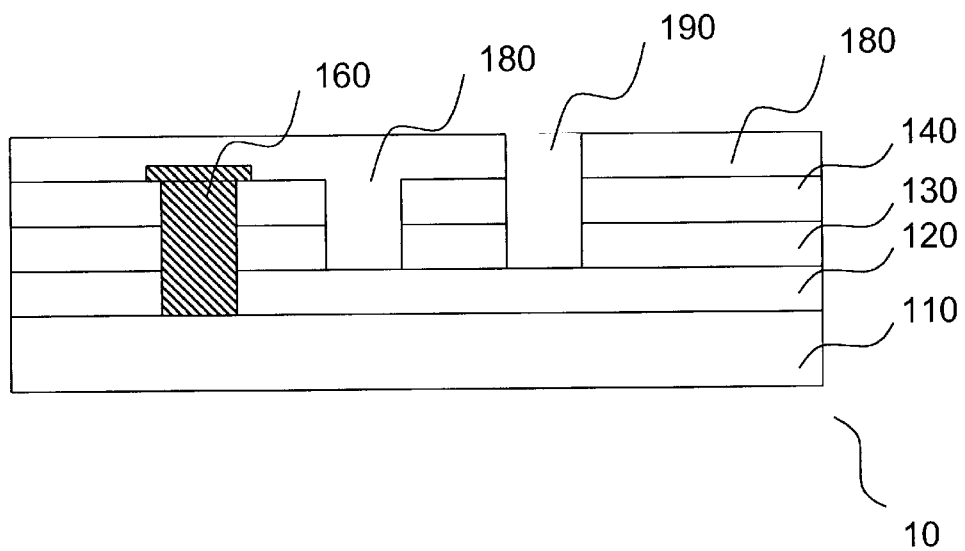
FIG. 1f is a schematic diagram of an embodiment of the present invention that illustrates a sixth stage in its production.

As depicted for example in FIG. 1f, one may further remove a third portion of cell (10) including translucent conductive oxide layer (180), n-type window layer (140), and p-type absorber layer (130), forming a third trench (190) defined by the edges of the remaining cell. This removal of a portion of cell (10) may be performed by, for example, the above described techniques.

Figure 1G:
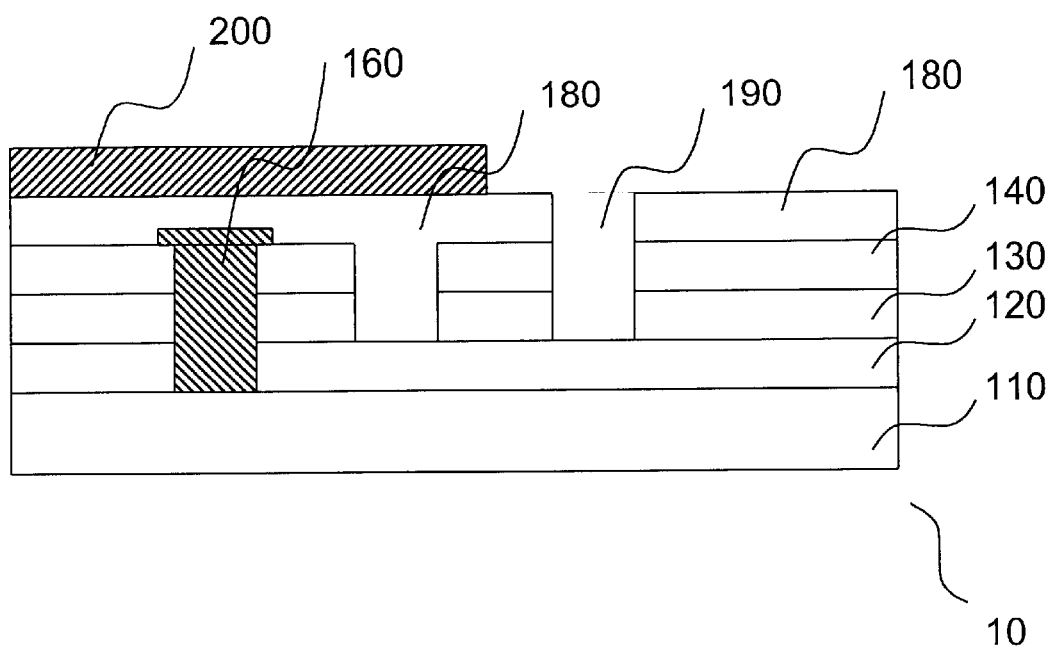
FIG. 1g is a schematic diagram of a preferred embodiment of the present invention.

As depicted for example in FIG. 1g, an opaque layer (200) may be added to a portion of cell (10) corresponding to the desired diodes. Opaque layer (200) may comprise an opaque material, such as, for example, a metal. Other translucent materials that are sufficiently opaque may be used. Other materials that are opaque at certain times, such as, for example materials such as are used in liquid crystal displays may be used, and may provide greater flexibility in the design of circuits which integrate the present invention. Other materials such as materials that are polarized in such a manner as to sufficiently shade or shadow the underlying layers may be used.

Figure 2:
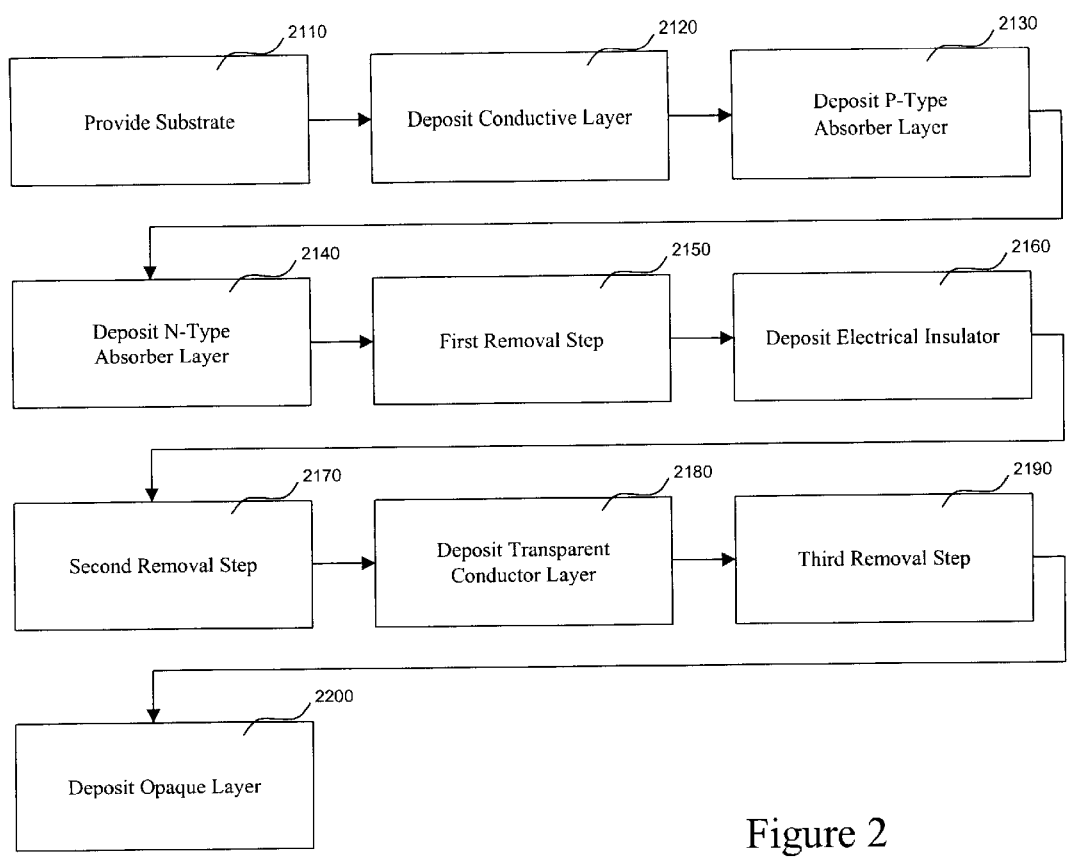
FIG. 2 is a flow diagram of a preferred embodiment of the method of the present invention.

FIG. 2 is a flow diagram of a preferred embodiment of the method of the present invention. One approach of the present invention is to begin by providing a photovoltaic cell. This cell may be created by a first step (2110) of providing a substrate, and then a second step (2120) of depositing on this substrate, a conducting layer. This step may be followed by a third step (2130) of depositing a p-type absorber layer on this conducting layer, and finally this may be followed by a step (2140) of depositing on this p-type absorber an n-type window layer. The substrate may, for example, comprise Upilex®. The conducting layer may, for example, comprise molybdenum. The p-type absorber layer may, for example, comprise a copper-indium-gallium-selenide device. The n-type window layer may, for example, comprise cadmium sulfide.

One may also perform the step (2150) of removing a portion of the cell including, for example, the n-type window layer, the p-type absorber layer, and the conducting layer, thereby producing a trench or groove defined by the edges of the remaining portions of the cell. A preferred way to remove these layers is by means of laser scribing. Other techniques include, for example, chemical etching and mechanical scribing. Using chemical etching may require the use of masking to prevent unwanted removal of other portions of the layers. Depending on the method of removal used, it may be desirable to clean the groove or trench to remove debris or other by-products of the removal process.

Additionally, one may perform the step (2160) of applying an insulating material to fill this trench. This insulating material may, for example, comprise a resistive ink. One may also perform a step (2170) of removing a portion of the cell parallel to the insulating material, removing the n-type window layer and p-type absorber layer, thereby defining a second trench. This step of removing a portion of the cell may be performed by, for example, the above described techniques. This removal step may, if desired, in the alternative be performed before or during the step of adding the insulating material.

A step (2180) of applying a layer of translucent conductive oxide, such as, for example, indium tin oxide (ITO), may be performed on the surface of the cell including the insulating material and trench. One may perform another step (2190) of removing a portion of the cell including the translucent conductive oxide layer, the n-type window layer, and the p-type absorber layer, forming a trench defined by the edges of the remaining cell. This step of removing of a portion of the cell may be performed by, for example, the above described techniques.

A step (2200) of adding an opaque layer may be performed on a portion of the cell corresponding to the desired diodes. The opaque layer may comprise any opaque material, such as, for example, a metal. Other translucent materials that are sufficiently opaque may be used. Other materials that are opaque at certain times, such as, for example materials such as are used in liquid crystal displays may be used, and may provide greater flexibility in the design of circuits which integrate the present invention. Other materials such as materials that are polarized in such a manner as to sufficiently shade or shadow the underlying layers are not precluded.

Figure 3:
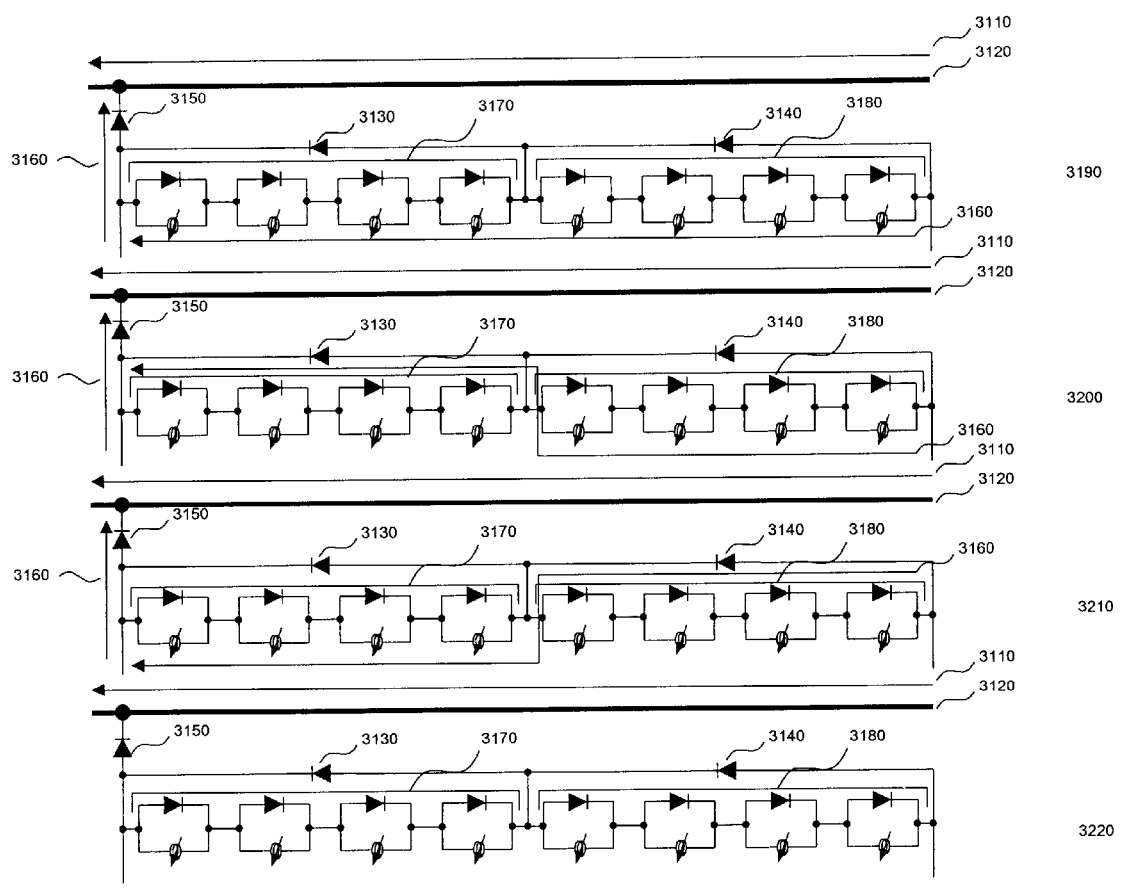
FIG. 3 is a circuit diagram of an embodiment of the present invention.

FIG. 3 depicts a circuit diagram of an embodiment of the present invention. The four conditions depicted are four possible conditions that a circuit of PV cells and diodes as depicted may encounter. A first condition (3190) occurs when both sets of PV cells (3170, 3180) are sufficiently illuminated. In this condition, current (3160) flows through PV cells (3170, 3180), and through the blocking diode (3150), but not through the bypass diodes (3130, 3140).

In the second condition (3200), in which the first set of PV cells (3170) is not sufficiently illuminated, current (3160) flows through the second set of PV cells (3180), as well as through first bypass diode (3130) and blocking diode (3150).

The third condition (3210) occurs when second set of PV cells (3180) receives insufficient illumination. In this condition, current (3160) flows through first set of PV cells (3170), as well as through the second bypass diode (3140) and blocking diode (3150). Finally, in the fourth condition (3220), neither set of PV cells (3170, 3180) is sufficiently illuminated. In this situation, blocking diode (3150) prevents current (3110) from the bus (3120) from entering the string.

Figure 4:
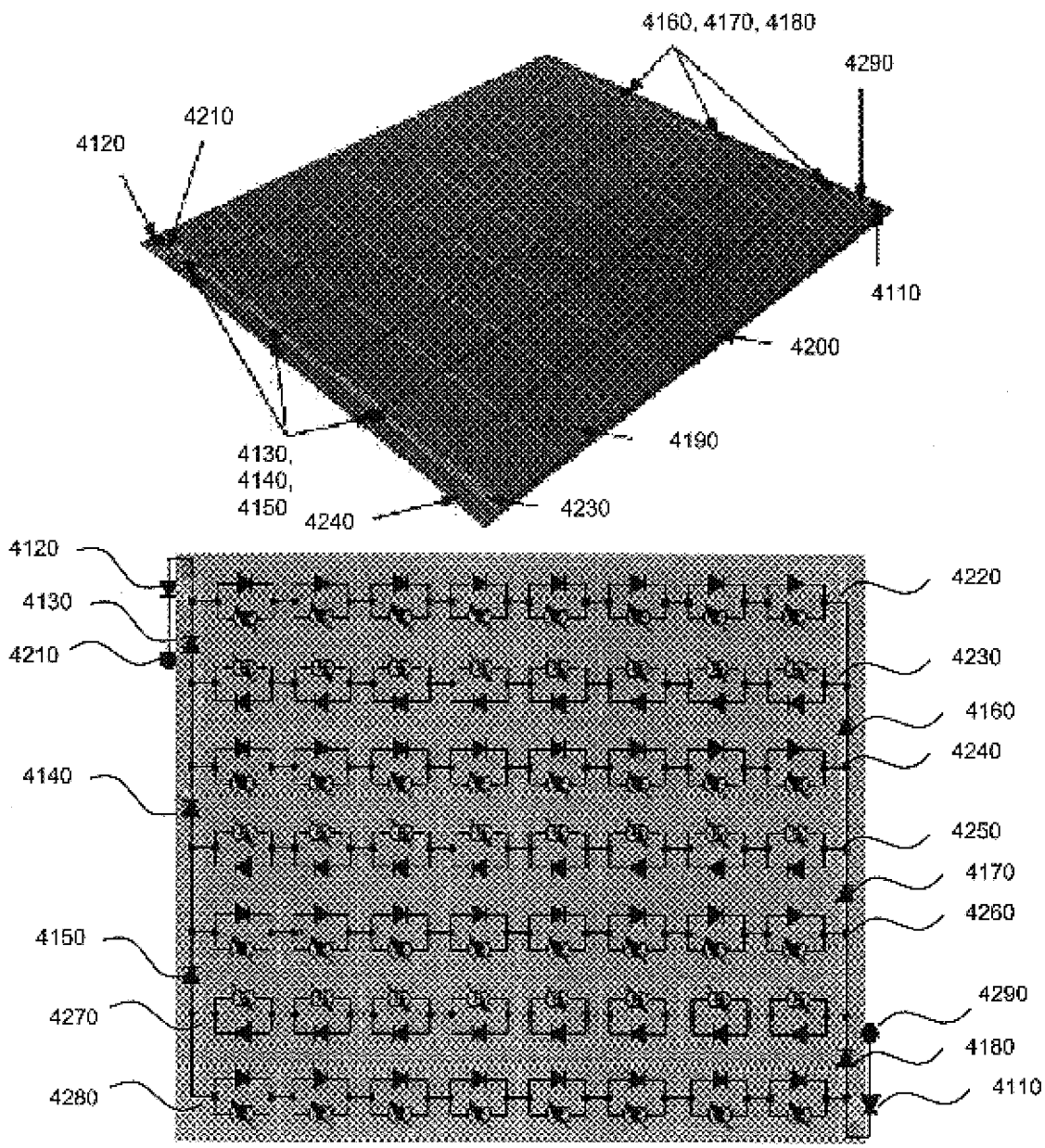
FIG. 4 depicts a perspective overview and corresponding circuit diagram of an embodiment of the present invention.

FIG. 4 depicts a perspective overview and corresponding circuit diagram of an embodiment of the present invention. In this example, the first blocking diode (4110) and second blocking diode (4120) prevent current from flowing through the string or module in a reverse direction from some outside source. Moreover, each horizontal string of PV cells (4220, 4230, 4240, 4250, 4260, 4270, 4280) is protected by a bypass diode (4130, 4160, 4140, 4170, 4150, 4180) that permits current to go past, rather than through, string (4220, 4230, 4240, 4250, 4260, 4270, 4280). As depicted, current will flow from the positive terminal (4290) to the negative terminal (4210) In the perspective drawing, one can observe the individual cells (4190) separated by the grooves (4200) as described herein. Additionally, one can observe an area (4240) which may be used to provide space for a Kapton® blanket, upon which a circuit may be printed.

Figure 5:
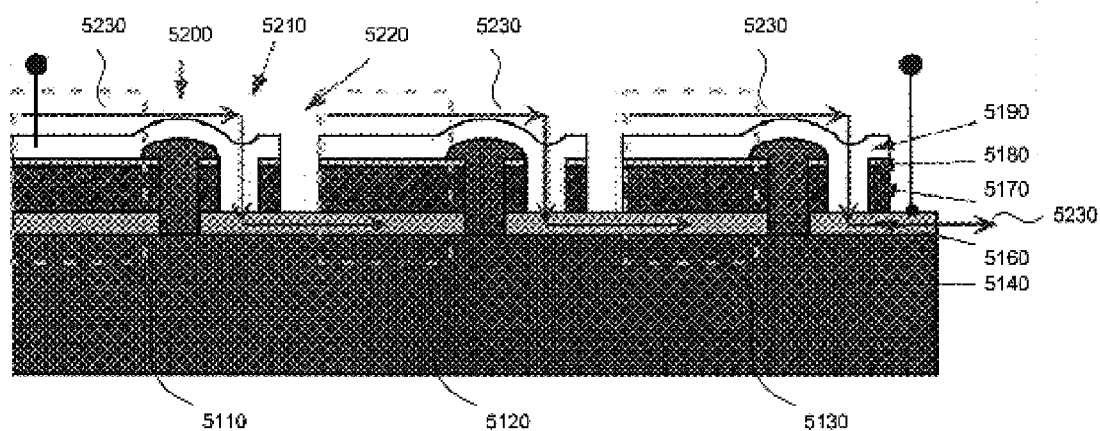
FIG. 5 depicts several PV cells in series, according to the method of the present invention disclosed herein.

FIG. 5 depicts several PV cells (5110, 5120, 5130) in series, according to the method of the present invention disclosed herein. Each PV cell (5110, 5120, 5130) shown comprises, on an Upilex® substrate (5140), a Molybdenum conductive layer (5160), a copper-indium-gallium-selenide device p-type absorber layer (5170), a cadmium sulfide n-type window layer (5180), and an indium-tin oxide translucent conductive layer (5190). For each PV cell (5110, 5120, 5130) there is a filled groove (5200) containing a resistive ink insulating layer that provides electrical isolation, and a filled groove (5210) containing indium tin oxide to provide a via for current flow. Each PV cell (5110, 5120, 5130) is separated from the adjacent cell by a third groove (5220), which, in this example, remains unfilled. It is important to note that the diagram does not depict any diodes; however, any of PV cells (5110, 5120, 5130) could be converted into a diode by preventing its illumination, in such a way as, for example, depositing a layer of opaque material on top of translucent conductive layer (5190). Also, it is important to note the expected flow of current (5230) through the series of cells (5110, 5120, 5130) under normal operating conditions.

Figure 6:
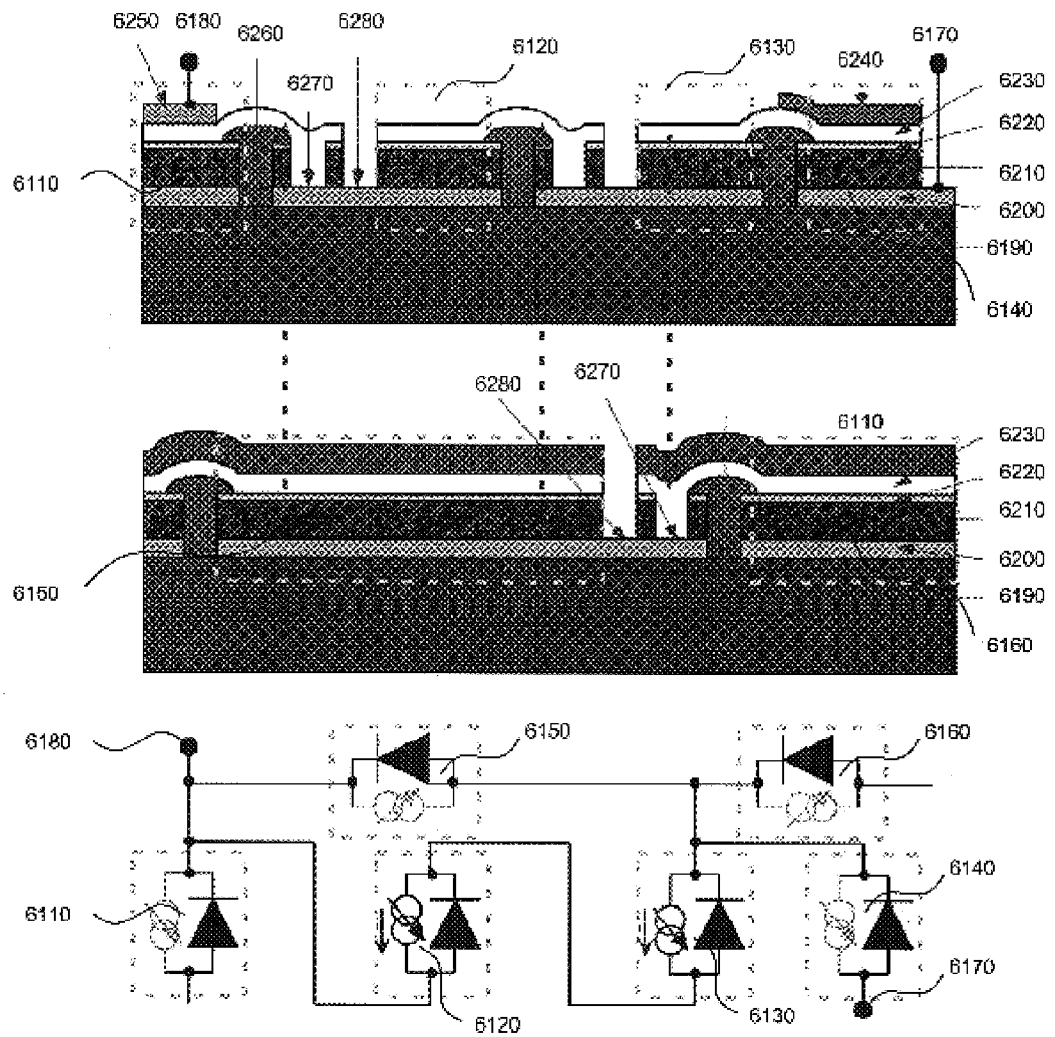
FIG. 6 depicts an embodiment of the present invention, including a pair of PV cells and accompanying diodes.

FIG. 6 depicts an embodiment of the present invention, including a pair of PV cells (6120, 6130) and accompanying diodes (6110, 6140, 6150, 6160). From the top, the first cross-section depicts an unused blocking diode (6110), a first PV cell (6120), a second PV cell (6130), and a blocking diode (6240). The second cross-section depicts a bypass diode (6150), and an unused bypass diode (6160). The circuit diagram depicts the combination of the above depicted diodes (6110, 6140, 6150, 6160) and PV cells (6120, 6130) into a power generation circuit. First PV cell (6120) and second PV cell (6130) are connected in series to one another. Blocking diode (6140) connects the negative terminal (6170) to second PV cell (6130). Bypass diode (6150) is connected in parallel to first PV cell (6120) and second PV cell (6130). The unused diodes (6110, 6160) are connected to the circuit by a single terminal. The output of first PV cell (6120) is at the positive terminal (6180). Each PV device (6110, 6120, 6130, 6140, 6150, 6160) shown comprises, on an Upilex® substrate (6190), a molybdenum conductive layer (6200), a copper-indium-gallium-selenide device p-type absorber layer (6210), a cadmium sulfide n-type window layer (6220), and an indium-tin oxide translucent conductive layer (6230). For each of the diodes (6110, 6140, 6150, 6160) an additional opaque layer comprising either a metallic contact (6250) or a thermal insulating layer (6240) is deposited on the translucent conductive layer (6230). For each PV device (6110, 6120, 6130, 6140, 6150, 6160), there is a filled groove containing a resistive ink insulating layer (6260) that provides electrical isolation, and a filled groove containing indium tin oxide (6270) to provide a via for current flow. Each PV device (6110, 6120, 6130, 6140, 6150, 6160) is separated from an adjacent device by a third groove (6280), which, in the present example, remains unfilled.

Figure 7:
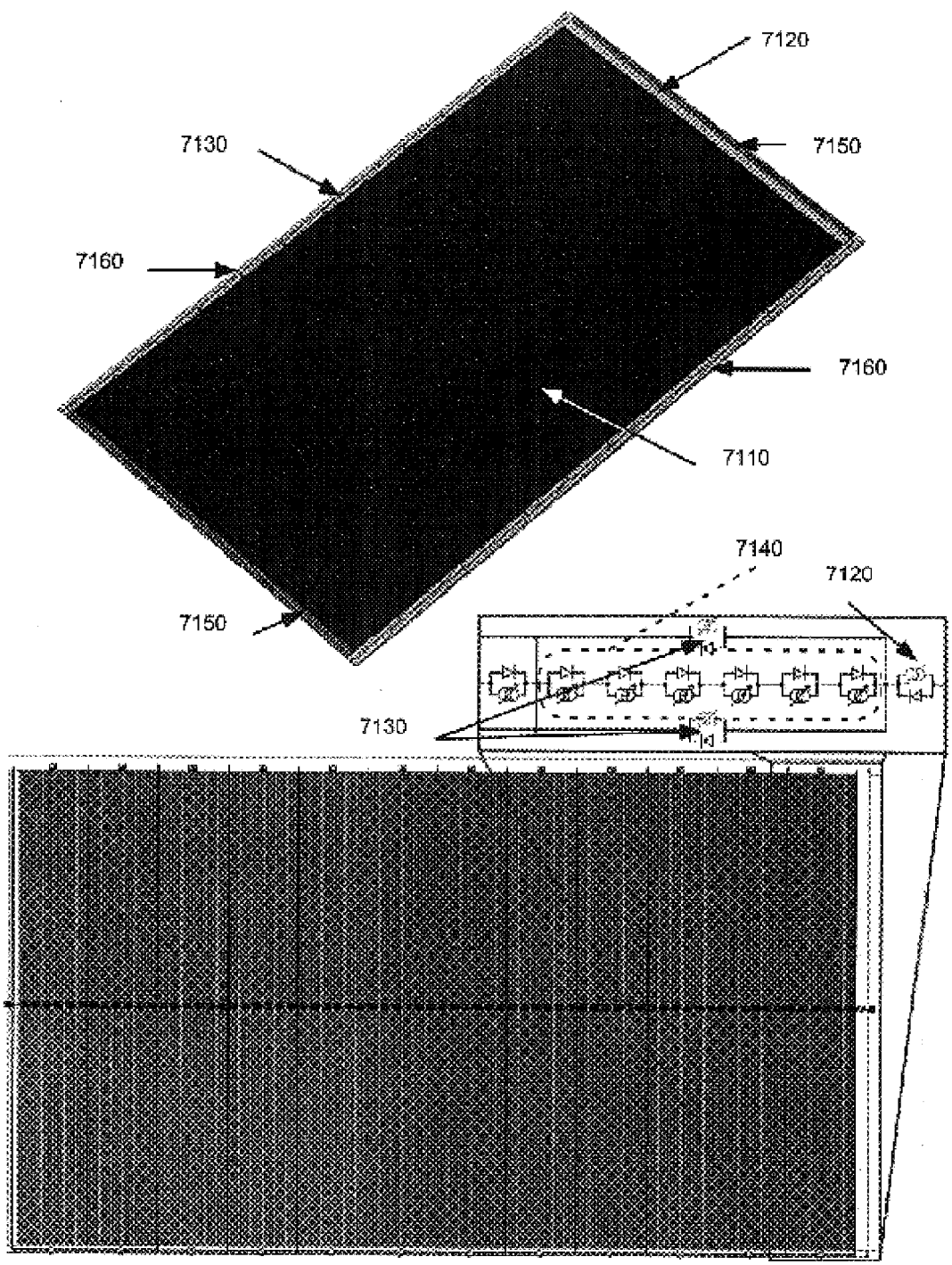
FIG. 7 depicts a perspective view, a stylized top view and an enlarged circuit diagram view of an embodiment of the present invention.

FIG. 7 depicts a perspective view, a stylized top view and an enlarged circuit diagram view of an embodiment of the present invention. In these depictions one can see an example of a 28 volt power supply module (7110) utilizing an embodiment of the present invention. In the depicted configuration, a blocking diode (7120) prevents the reverse flow of current through the module (7110). Additionally, a pair of bypass diodes (7130) is placed in parallel to each string of six PV cells (7140). Finally, two sides of the module provide terminals (7150), and two sides of the module provide electrical isolation (7160).

Figure 8:
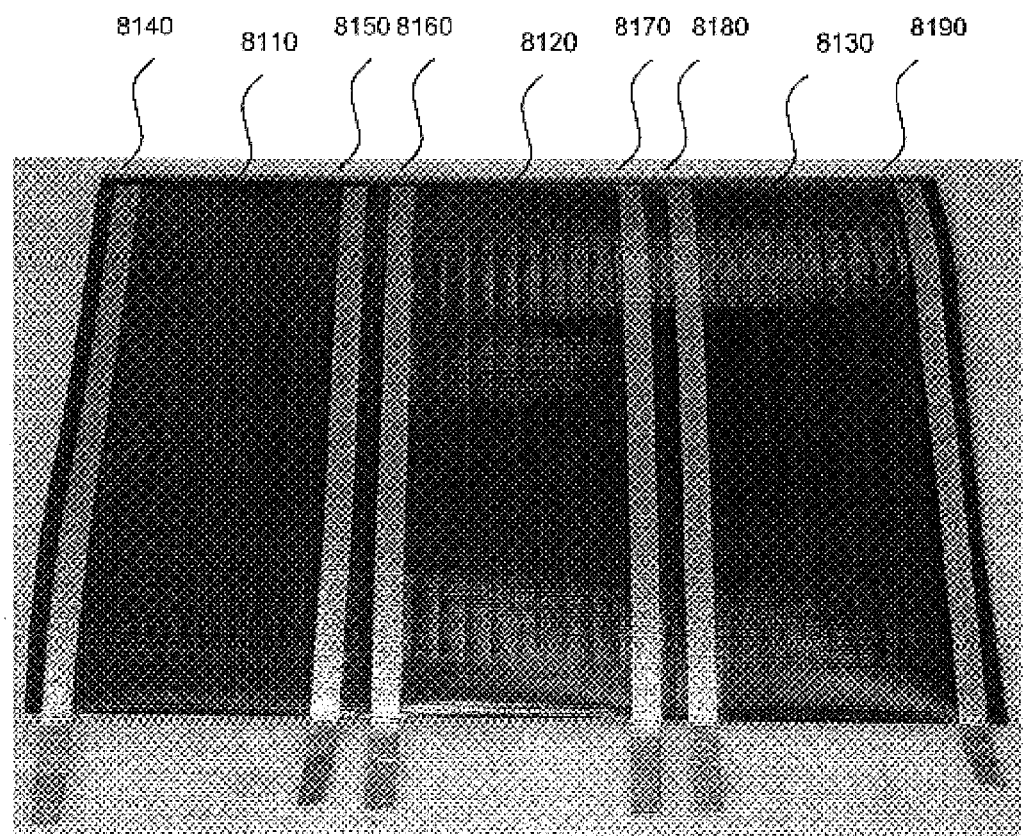
FIG. 8 is a photograph of an embodiment of the present invention.

FIG. 8 is a photograph of an embodiment of the present invention. This embodiment comprises three isolated cell strings (8110, 8120, 8130) with bypass diodes (8140, 8150, 8160, 8170, 8180, 8190). This module has been laminated for protection.

Figure 9:
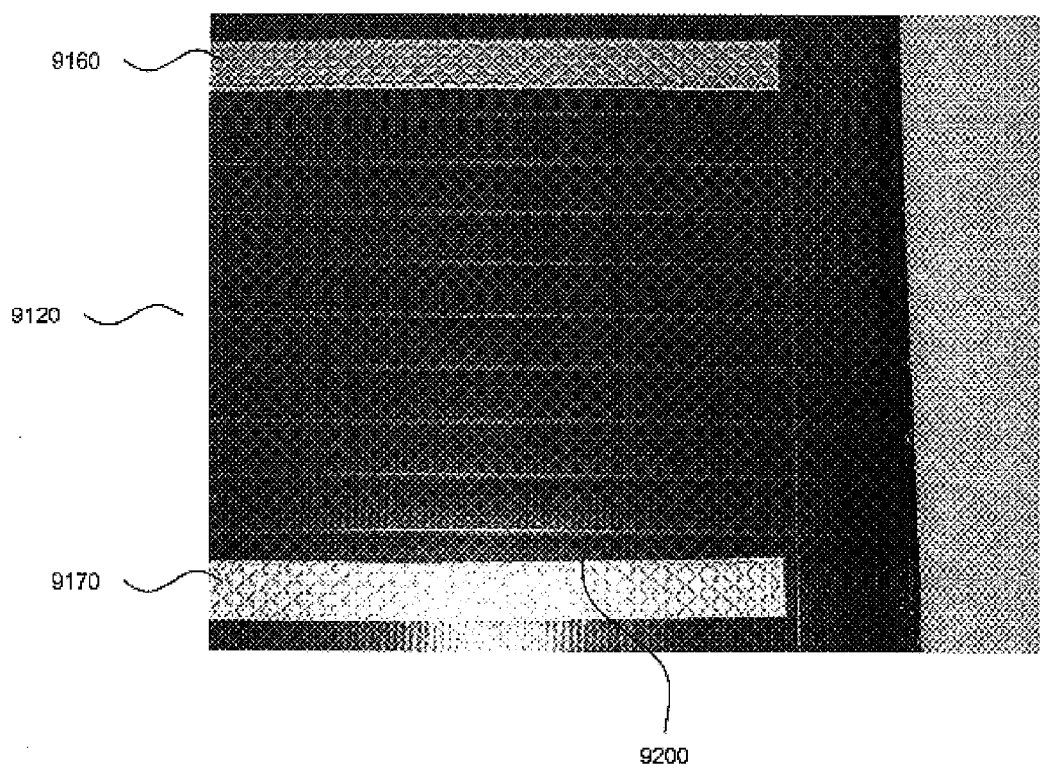
FIG. 9 is a close-up photograph of an embodiment of the present invention.

FIG. 9 is a close-up photograph of an embodiment of the present invention. One can observe the scribes or grooves (9200) arising from an embodiment of the method of the present invention.

Figure 10:
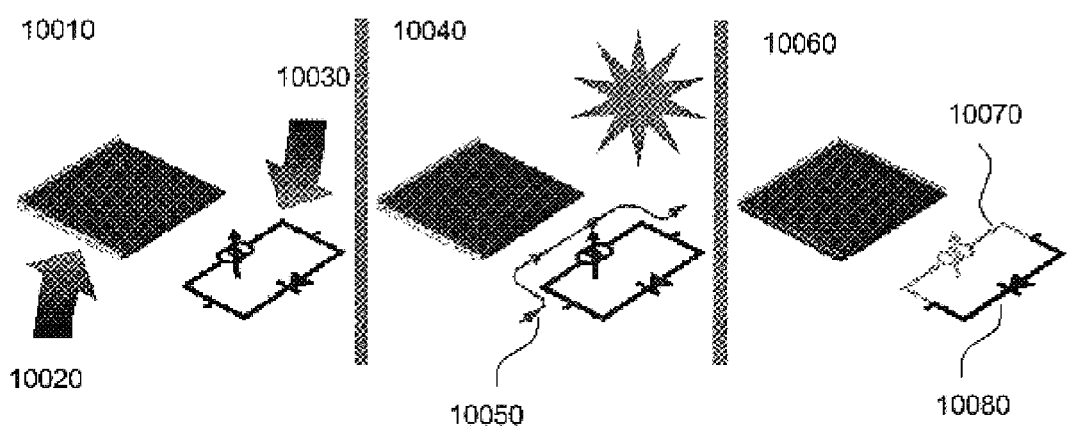
FIG. 10 is an illustration of the operation of a PV cell.

FIG. 10 is a three-panel depiction of the operation of a PV cell. The first panel (10010) indicates distinguishes between the PV cell (10020) and the equivalent circuit (10030). The second panel (10040) depicts the equivalent circuit (10030) when a suitable amount of illumination is present. It is important to note that current (10050) flows in this situation. The third panel (10060) depicts the equivalent circuit (10030) when an insufficient amount of illumination is present. It is important to note that if any current flows in this situation it is through the diode component (10080) of the equivalent circuit (10030).

Figure 11:
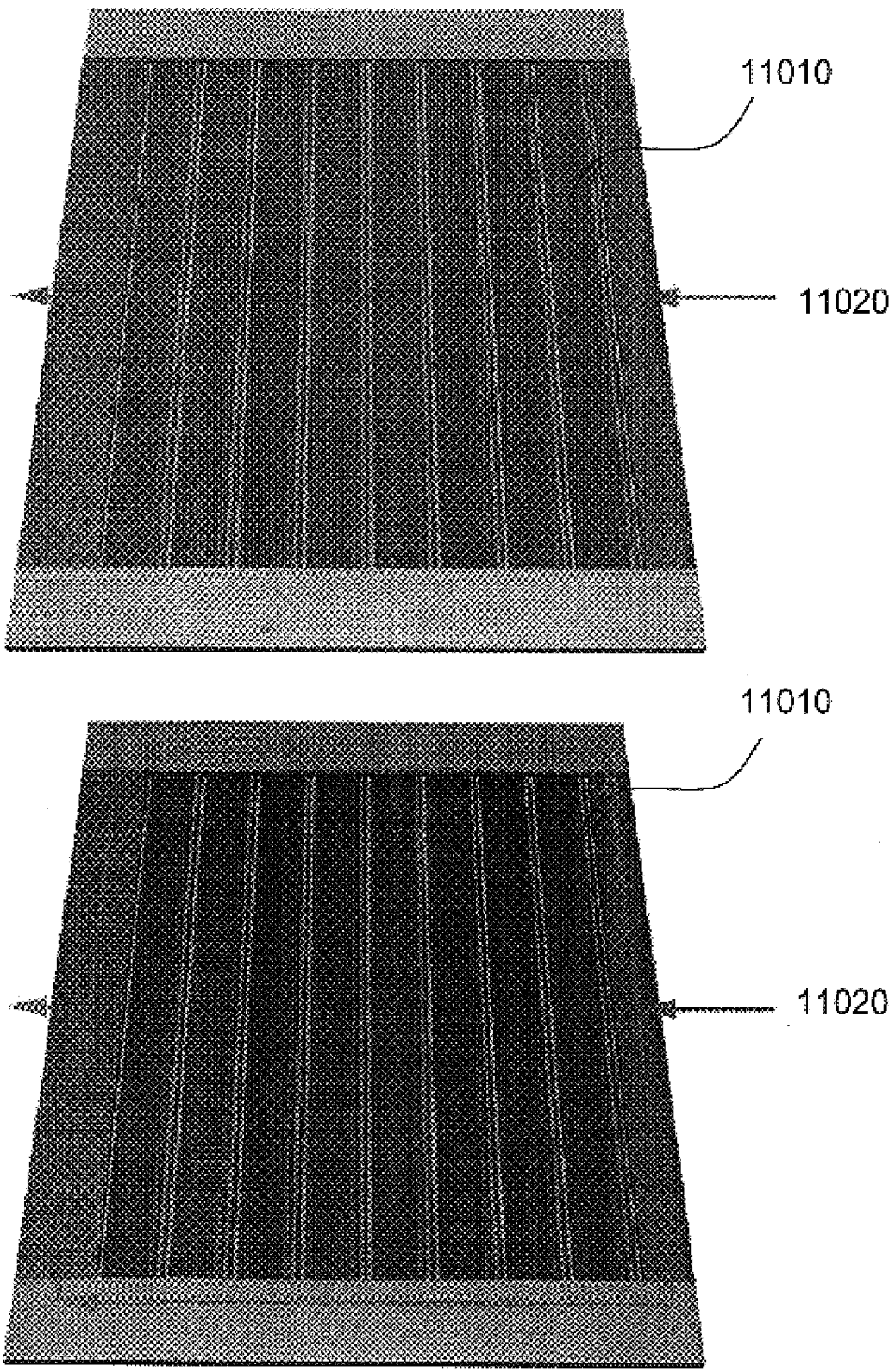
FIG. 11 is a depiction of the operation of a module of PV cells according to the resent invention.

FIG. 11 is a depiction of the operation of a module of PV cells (11010) that utilizes an embodiment of the present invention. The top depiction shows the path that current from other modules in a string of modules (11020) takes when the module (11010) is sufficiently illuminated. The bottom depiction shows the path that current from the other modules in a string of modules (11020) takes when the module (11010) is insufficiently illuminated.

Other embodiments of the invention will be apparent to those skilled in the art from consideration of the specification and the practice of the invention disclosed herein. It is intended that the specification and examples be considered as exemplary only, with a true scope and spirit of the invention being indicated by the following claims.

What is claimed is:

1. An apparatus for use as a diode comprising
   a substrate layer,
   a conductive layer deposited on said substrate layer,
   an p-type absorber layer deposited on said conductive layer,
   a n-type window layer deposited on said p-type absorber layer,
   a first trench area on said substrate layer, and formed into said conductive layer, said p-type absorber layer, and said n-type window layer;
   an electrical insulator layer deposited on said first trench area;
   a second trench area parallel to said first trench area, on said conductive layer and formed into said p-type absorber layer and said n-type window layer;
   a translucent conductive layer deposited on said n-type window layer, said electrical insulator, and said second trench area;
   a third trench area near said second trench area, on said conductive, layer and formed into said p-type absorber layer, said n-type window layer, and said translucent conductive layer; and
   an opaque layer deposited on a portion of said translucent conductive layer.

2. The apparatus of claim 1, wherein said substrate layer comprises a material selected from a group consisting of an electrically insulating polyimide, Upilex®, polyphenylene benzobis oxazole (PBO), polyamide, polyether ether ketone, and metallic foils coated with electrically insulating polyimide, Upilex®, PBO, polyamide, and polyether ether ketone.

3. The apparatus of claim 1, wherein said conductive layer comprises a material selected from a group consisting of molybdenum, a transparent conductive oxide, brass, titanium, nickel, and nickel-vanadium.

4. The apparatus of claim 1, wherein said p-type absorber layer comprises
   a first material selected from a group consisting of copper, copper-silver, and silver;
   a second material selected from a group consisting of indium, indium-gallium, indium-aluminum, and aluminum; and
   a third material selected from a group consisting of selenide, selenide-sulfer, and sulfer.

5. The apparatus of claim 1, wherein said n-type window layer comprises a material selected from a group consisting of cadmium sulfide, cadmium zinc sulfide, zinc sulfide, zinc selenide, cadmium selenide, zinc-indium selenide, and indium selenide.

6. The apparatus of claim 1, wherein said electrical insulator layer comprises a material selected from a group consisting of a resistive ink, a dielectric, a pottant, and an encapsulant.

7. The apparatus of claim 1, wherein said translucent conductor layer comprises a material that is transparent.

8. The apparatus of claim 1, wherein said translucent conductor layer comprises a metallic grid.

9. The apparatus of claim 1, wherein said translucent conductor layer comprises a translucent conductive oxide.

10. The apparatus of claim 1, wherein said translucent conductor layer comprises indium tin oxide.

11. The apparatus of claim 1, wherein said opaque layer comprises an opaque material.

12. The apparatus of claim 1, wherein said opaque layer comprises a metal.

13. The apparatus of claim 1, wherein said opaque layer comprises a material selected from a group consisting of aluminum, molybdenum, silver, and titanium.

14. The apparatus of claim 1, wherein said opaque layer comprises a material having a plurality of phases, at least one of which is opaque.

15. The apparatus of claim 14, wherein said material having a plurality of phases has at least one phase that is translucent.

16. An apparatus for use as a module of photovoltaic cells with integrated diodes comprising the apparatus of claim 1, wherein said third trench area defines a plurality of photovoltaic devices.

17. The apparatus of claim 16, wherein said photovoltaic devices are selected from a group consisting of photovoltaic cells, diodes, capacitors, and resistors.

* * * * *